US012645139B2

(12) United States Patent
Klun et al.

(10) Patent No.: US 12,645,139 B2
(45) Date of Patent: Jun. 2, 2026

(54) FREE-RADICALLY POLYMERIZABLE COMPOUNDS, COMPOSITIONS INCLUDING THE SAME, POLYMERIZED COMPOUNDS, METHODS OF MAKING AND ARTICLES INCLUDING THE SAME

(71) Applicant: 3M INNOVATIVE PROPERTIES COMPANY, St. Paul, MN (US)

(72) Inventors: Thomas P. Klun, Lakeland, MN (US); Matthew R.D. Smith, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 18/701,807

(22) PCT Filed: Nov. 11, 2022

(86) PCT No.: PCT/IB2022/060875
§ 371 (c)(1),
(2) Date: Apr. 16, 2024

(87) PCT Pub. No.: WO2023/099995
PCT Pub. Date: Jun. 8, 2023

(65) Prior Publication Data

US 2025/0004373 A1 Jan. 2, 2025

Related U.S. Application Data

(60) Provisional application No. 63/404,981, filed on Sep. 9, 2022, provisional application No. 63/285,586, filed on Dec. 3, 2021.

(51) Int. Cl.
*C08G 77/388* (2006.01)
*C08G 77/458* (2006.01)
(Continued)

(52) U.S. Cl.
CPC ......... *G03F 7/0388* (2013.01); *C08G 77/388* (2013.01); *C08G 77/458* (2013.01);
(Continued)

(58) Field of Classification Search
CPC . C08F 299/065; C08G 18/227; C08G 18/289; C08G 18/673; C08G 18/7831;
(Continued)

(56) References Cited

U.S. PATENT DOCUMENTS

| | | | | |
|---|---|---|---|---|
| 7,718,264 | B2 | 5/2010 | Klun et al. | |
| 8,147,966 | B2 | 4/2012 | Klun et al. | |
| 8,476,398 | B2 | 7/2013 | Thomas et al. | |
| 9,790,396 | B2 | 10/2017 | Klun et al. | |
| 2007/0112161 | A1* | 5/2007 | Roesler | C09D 175/16 528/25 |

(Continued)

FOREIGN PATENT DOCUMENTS

| | | | |
|---|---|---|---|
| CN | 111662573 | A | 9/2020 |
| WO | 2002037143 | A2 | 5/2002 |

(Continued)

OTHER PUBLICATIONS

International Search Report for PCT Application No. PCT/IB2022/060875, mailed on Jan. 25, 2023, 4 pages.

(Continued)

*Primary Examiner* — Mark F. Huff
*Assistant Examiner* — Richard David Champion
(74) *Attorney, Agent, or Firm* — Carolyn A. Fischer

(57) ABSTRACT

Free-radically polymerizable compounds having a poly(d-iakylsiloxane) segment and at least one acryl group are disclosed. Compositions including the same, polymerized compounds, methods of making and articles including the same are also disclosed.

10 Claims, 1 Drawing Sheet

(51) Int. Cl.

| | |
|---|---|
| ***G03F 7/00*** | (2006.01) |
| ***G03F 7/038*** | (2006.01) |
| *C08F 299/06* | (2006.01) |
| *C08G 18/22* | (2006.01) |
| *C08G 18/28* | (2006.01) |
| *C08G 18/67* | (2006.01) |
| *C08G 18/78* | (2006.01) |
| *C08G 18/83* | (2006.01) |
| *C09D 175/16* | (2006.01) |

(52) U.S. Cl.
CPC ........ *G03F 7/70025* (2013.01); *C08F 299/06* (2013.01); *C08G 18/22* (2013.01); *C08G 18/28* (2013.01); *C08G 18/67* (2013.01); *C08G 18/78* (2013.01); *C08G 18/83* (2013.01); *C09D 175/16* (2013.01)

(58) Field of Classification Search
CPC .. C08G 18/837; C08G 77/388; C08G 77/458; C09D 175/16; G03F 7/0388; G03F 7/70025
See application file for complete search history.

(56) References Cited

U.S. PATENT DOCUMENTS

| | | | | |
|---|---|---|---|---|
| 2017/0335076 | A1* | 11/2017 | Hatakeyama .............. | C08J 5/18 |
| 2021/0347135 | A1 | 11/2021 | Van et al. | |
| 2023/0120588 | A1* | 4/2023 | He ....................... | C08G 18/672<br>528/65 |
| 2023/0193074 | A1 | 6/2023 | Klun et al. | |
| 2024/0043989 | A1 | 2/2024 | Smith et al. | |

FOREIGN PATENT DOCUMENTS

| | | | | |
|---|---|---|---|---|
| WO | WO-0237143 | A2 * | 5/2002 | ........... C03C 25/106 |
| WO | 2017003870 | A1 | 1/2017 | |
| WO | 2020095258 | A1 | 5/2020 | |

OTHER PUBLICATIONS

Shelkovnikov, “Synthesis and Thermomechanical Properties of Hybrid Photopolymer Films Based on the Thiol-siloxane and Acrylate Oligomers”, 2015, Journal of Materials Science, vol. 50, No. 23, pp. 7544-7556.

* cited by examiner

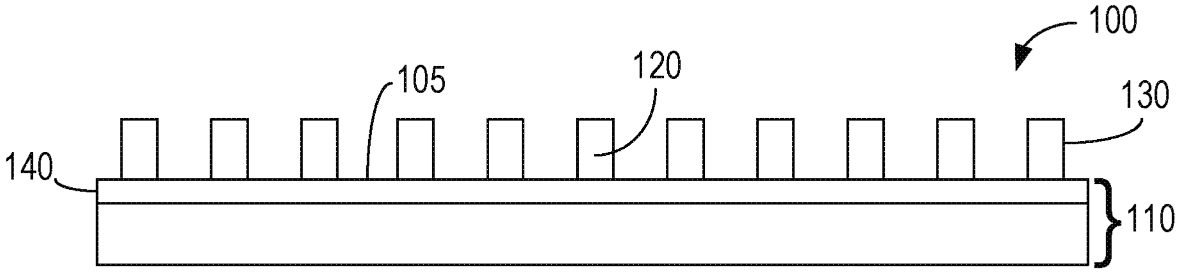
100
105
120
130
140
110

FREE-RADICALLY POLYMERIZABLE COMPOUNDS, COMPOSITIONS INCLUDING THE SAME, POLYMERIZED COMPOUNDS, METHODS OF MAKING AND ARTICLES INCLUDING THE SAME

BACKGROUND

"Metasurfaces" are nanopatterned two-dimensional surfaces that can be used to create conventional optical components such as gratings, lenses, mirrors, holograms, waveplates, polarizers and spectral filters. These materials can be created via a variety of methods including, for example, electron beam lithography. However, there remains a need for continuous, high throughput methods of creating patterned nanostructures.

One continuous roll-to-roll manufacturing method uses a nanostructured film as a patterned etch mask. The patterned etch mask can be made by coating precisely controlled thickness of an ultraviolet electromagnetic radiation (UV) curable acrylic material into recesses of a release-treated nanostructured film such that the UV curable material protrudes slightly above the tooling features (e.g., often 50-200 nanometers above the surface). The resulting coated tooling film is then laminated against a silicone-containing oxide surface, cured UV exposure to UV radiation, and separated to transfer the structure from the release-treated nanostructured film onto the oxide coated film. Subsequent processing of this structured film can yield a useful metasurface.

SUMMARY

One problem associated with the abovementioned process is providing suitable UV curable formulations that can: 1) wet out onto the release-treated nanostructured film during coating; and 2) transfer to an oxide surface upon curing and delamination.

The present disclosure provides UV-curable polysiloxane-based materials that can provide good wetting of the release-treated nanostructured film and adhesion to the oxide coated substrate.

In one aspect, the present disclosure provides, a free-radically polymerizable compound represented by the formula:

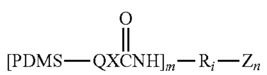

wherein:

- $R_i$ is a $C_1$-$C_{60}$ organic group having a valence of m+n;
- each PDMS independently represents a monovalent group containing a poly(dialkylsiloxane) segment;
- each Q is independently a covalent bond or an organic linking group having a valence of at least 2;
- each X is independently O, S, or $NR^1$, wherein each $R^1$ is independently H or a $C_1$-$C_4$ alkyl group;
- m and n are independently integers≥1; and
- each Z independently represents:

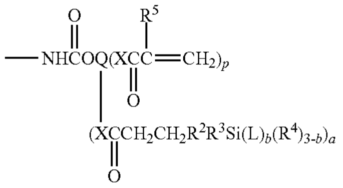

wherein:

- $R^2$ is —S— or —$N(R^6)$—, wherein $R^6$ is H, a $C_1$-$C_4$ alkyl group, or —$R^3Si(L)_b(R^4)_{3-b}$;
- $R^3$ is a divalent alkylene group optionally substituted by one or more catenary oxygen atoms;
- $R^4$ is a monovalent nonhydrolyzable group;
- $R^5$ is H or methyl;
- each L is independently a monovalent hydrolyzable group;
- each b is independently 1, 2, or 3; and
- a and p are independently integers greater than or equal to 0, wherein: $1 \le (a+p) \le 6$; for at least one Z, a is at least 1; and for at least one Z, p is at least 1.

In another aspect, the present disclosure provides a free-radically polymerizable reaction product of components comprising:

- i) a urethane compound comprising a poly(dialkylsiloxane) segment and at least two (meth)acryl groups; and
- ii) an organosilane compound comprising hydrolyzable groups and a group selected from amino or mercapto groups, wherein the equivalent ratio of components i) and ii) is greater than one such that (meth)acryl groups remain unreacted.

In another aspect, the present disclosure provides a free-radically polymerizable compound represented by the formula:

wherein each Z independently represents:

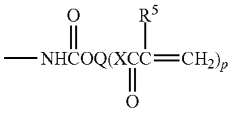

wherein:

- $R^5$ is H or methyl; and
- for at least one Z, p is at least 2.

In another aspect, the present disclosure provides a free-radically polymerizable reaction product of components comprising:

- i) a compound comprising at least two isocyanate groups;
- ii) a compound comprising a poly(dialkylsiloxane) segment and an isocyanate-reactive group; and
- iii) a compound comprising an isocyanate reactive group and at least two (meth)acrylate groups.

In yet another aspect, the present disclosure provides a method of making a polymerized composition, the method comprising:

providing a polymerizable composition comprising at least one free-radically polymerizable compound according to the present disclosure; and free-radically polymerizing the polymerizable composition to provide the polymerized composition.

In yet another aspect, the present disclosure provides a method of making an article, the method comprising the steps:

a) disposing a layer of a free-radically polymerizable composition according to the present disclosure on a mold surface of a first substrate, wherein the mold surface comprises a pattern including nanostructures;

b) contacting the layer of the free-radically polymerizable composition with a metal oxide surface of a second substrate;

c) free-radically polymerizing at least a portion of the free-radically polymerizable composition to provide a polymerized composition; and d) separating the polymerized composition from the mold surface.

In yet another aspect, the present disclosure provides an article comprising a polymerized reaction product disposed on a surface of a substrate made according to the method.

As used herein:

The term "actinic radiation" refers to electromagnetic radiation in the wavelength range of 200 to 720 nm that is absorbed by a molecule thereby directly or indirectly forming free radicals.

The term "catenary" in reference to an atom means that it is positioned within the longest continuous chain of atoms of a group or molecule.

The abbreviation "$C_f$-$C_g$" in reference to a chemical group means containing from f to g carbon atoms, inclusive.

The term "effective amount of actinic radiation" refers to sufficient actinic radiation to result in free-radical polymerization.

The prefix "(meth)acryl" refers to "acryl" and/or "methacryl".

The term "residue of a polyisocyanate" refers to that polyvalent portion of a polyisocyanate that remains after removal of its —N═C═O groups.

The term "urethane compound" refers to any organic compound containing at least one divalent group represented by the formula

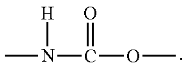

Features and advantages of the present disclosure will be further understood upon consideration of the detailed description as well as the appended claims.

BRIEF DESCRIPTION OF THE DRAWING

FIG. 1 is a schematic side view of an exemplary article 100 according to one embodiment of the present disclosure.

It should be understood that numerous other modifications and embodiments can be devised by those skilled in the art, which fall within the scope and spirit of the principles of the disclosure. The FIGURES may not be drawn to scale.

DETAILED DESCRIPTION

Presently described are free-radically polymerizable compounds comprising at least one polysiloxane group, at least one silyl group with hydrolyzable substituents, and at least one (meth)acryl group.

In many embodiments, the free-radically polymerizable compounds can be represented by Formula I, below:

(Formula 1)

$R_i$ is a $C_1$-$C_{60}$ organic group having a valence of m+n. In some embodiments, $R_i$ has 1 to 50 carbon atoms, 1 to 40 carbon atoms, 1 to 30 carbon atoms, 1 to 20 carbon atoms, or 1 to 10 carbon atoms. Due to one convenient method of making the free-radically polymerizable compounds from respective polyisocyanates, $R_i$ often corresponds to the residue of a polyisocyanate. There is no particular additional limitation the structure or composition of $R_i$, although in many embodiments, $R_i$ is composed of C, H, and optionally N, O, and/or S atoms (although this is not a requirement). Exemplary $R_i$ groups can be residues of polyisocyanates including diisocyanates, triisocyanates, and diisocyanate oligomerization products.

By way of illustration, Desmodur N100 has the nominal structural formula:

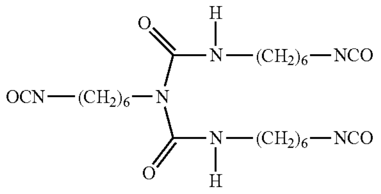

and hence its nominal residue is:

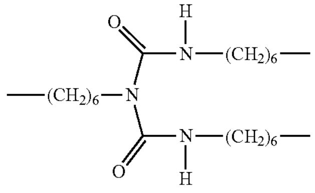

Numerous aliphatic or aromatic polyisocyanates may be used in the preparation of polymerizable compositions according to the present disclosure. Suitable polyisocyanates include diisocyanates having two —NCO groups and polyisocyanates having three of more —NCO groups. Polyisocyanates can be made by known methods and/or obtained from commercial sources. Exemplary commercially available polyisocyanates include those available as Desmodur 3300, Desmodur TPLS2294, Desmodur N 3600, and Desmodur N 100, all from Covestro AG of Leverkusen, Germany; 2,4- and 2,6-tolylene diisocyanates; methylene diisocyanate; ethylene diisocyanate; propylene diisocyanate; butylene diisocyanate; hexamethylene diisocyanate; octamethylene diisocyanate; decamethylene diisocyanate; cyclohexylene diisocyanate; o-, in-, and p-methylenediphenyl diisocyanates; naphthalene diisocyanate; polymethylene bis (phenyl isocyanate); 3,5,3',5'-bixylylene-4,4'-diisocyanate; bis(2-isocyanatoethyl) ether; bis(2-isocyanatoethyl) ether of ethylene glycol; o-, m-, and p-phenylene diisocyanates; 3,3'-bitolylene-4,4'-diisocyanate; diphenyl ether 4,4'-diisocyanate; 3,5,3',5'-bixylylene-4,4'-diisocyanate; diphenylmethane-4,4'-diisocyanate; biphenylene diisocyanate; and 3,3'-dimethoxy-biphenylene-4,4'-diisocyanate, and naphthalene diisocyanate.

Oligomers are often present in commercially available polyisocyanates due to the methods used for their manufacture. For example, some representative hexamethylene diisocyanate (HDI) oligomers are depicted as follows:

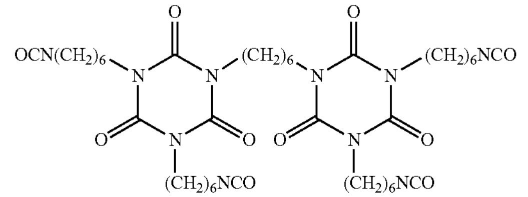

and

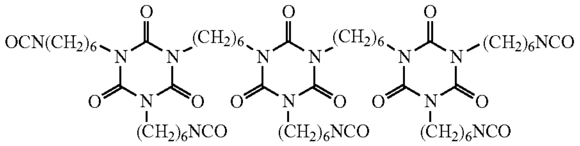

If present, the concentration of such oligomers is often less than 40, less than 35, less than 30, less than 25, less than 20, less than 15, less than 10, or even less than 5 percent by weight. In view of inclusion of oligomer(s), the number of isocyanato (—NCO) groups is often reported as an average value, especially for commercial polyisocyanates. For example, when a polyisocyanate is characterized as a triisocyanate, most of the polyisocyanate bulk composition material will be a triisocyanate; however, the average —NCO functionality is often a non-integer that is greater than 3. For example, Desmodur 3300 is described as having a functionality of >3.2.

Referring again to Formula I, each PDMS independently represents a monovalent group containing a poly(dialkylsiloxane) segment.

In many embodiments, useful PDMS groups can be described by the formula:

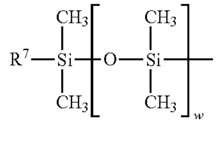

wherein:

each $R^7$ represents a hydrocarbyl group having from 1 to 8 carbon atoms (e.g., methyl, ethyl, propyl, butyl, phenyl, hexyl, octyl); and each w represents an integer greater than or equal to 5 (e.g., 5 to 20, 5 to 50, or 5 to 100).

The PDMS group (e.g. segment) can have a molecular weight (Mn) of at least 500, 750, or 1000 g/mole. The PDMS group typically has a molecular weight (Mn) no greater than 10,000 or 5,000 g/mole. In some embodiments, the PDMS group has a molecular weight (Mn) less than 5000, 4500, or 3000 g/mole. For example, when 0.35 equivalents of a compound prepared from 5000 or 4700 g/mole molecular weight PDMS was utilized in the absence of an amino silane compound, wettability and transfer can be poor. However, the compounds having poor wettability and transfer are surmised to be suitable for other uses, such as a release layer of an adhesive tape.

Referring again to Formula I, each Q is independently a covalent bond or an organic linking group having a valence of at least 2 (e.g., at least 2, at least 3, at least 4, at least 5, at least 6, at least 7, at least 8, at least 9, or even at least 10).

Q can be a straight or branched chain and/or a ring-containing connecting group. On some embodiments Q can be alkylene, arylene, aralkylene, or alkarylene. Q can optionally include one or more heteroatoms (e.g., catenary heteroatoms) such as O, N, S, and combinations thereof. Q can also optionally include one or more heteroatom-containing divalent functional groups such as, for example, carbonyl, sulfonyl, or a combination thereof. In many embodiments, Q contains from 0 to 20 carbon atoms (often 2 to 12 carbon atoms or 2 to 6 carbon atoms), although this is not a requirement. Exemplary Q groups include a covalent bond, methylene, ethan-1,2-diyl, propan-1,3-diyl, propan-1,2-diyl, butan-1,4-diyl, pentan-1,5-diyl, hexan-1,6-diyl, cyclohexan-1,4-diyl, octan-1,8-diyl, dodecan-1,12-diyl, hexadecan-1,16-diyl, eicosan-1,20-diyl, $—CH_2C(=O)CH_2—$, $—CH_2CH_2OCH_2CH_2—$, and $—OCH_2CH_2OCH_2CH_2OCH_2CH_2—$.

Referring again to Formula I, each X is independently O, S, or $NR^1$, wherein each $R^1$ is independently H or a $C_1$-$C_4$ alkyl group. Examples of $C_1$-$C_4$ alkyl groups include methyl, ethyl, propyl, isopropyl, butyl, and isobutyl.

In some embodiments, each Q adjacent to a PDMS is propan-1,3-diyl and the X to which that Q is bonded is NH. In some embodiments, proceeding from left to right in Formula I, each Q adjacent to PDMS is $—CH_2CH_2CH_2OCH_2CH_2—$, and the X to which that Q is bonded is O.

Subscripts m and n are independently integers greater than or equal to one (i.e., at least one). In many embodiments, the quantity (m+n) is less than or equal to ten, in some embodiments (m+n) is less than or equal to six, however this is not a requirement. Examples of m include, 1, 2, 3, 4, 5, 6, 7, 8, and 9. Of these, m=1, 2, 3, 4, or 5 is often used, and m=1, 2, or 3 is often preferred. Examples of n include, 1, 2, 3, 4, 5, 6, 7, 8, and 9. Of these, n=1, 2, 3, 4, or 5 is often used, and n=1, 2, or 3 is often preferred.

In some embodiments, $2\leq(m+n)\leq10$, although (m+n) may be greater than 10. In some embodiments, $2\leq(m+n)\leq6$ or 2 $(m+n)\leq3$. In some embodiments, m=1, n=1, and the average values of a and p per Z group are each at least 1. In some embodiments, m=1, n=2, and the average values of a and p per Z group are each at least 1. In some embodiments, m=1, n=2, and wherein for at least one Z a=0 and p=1, and for at least one other Z, a=1 and p=0. In some embodiments, $4\leq(m+n)\leq10$, $3\leq n\leq9$, for at least one Z a=0 and p=1, and for at least one other Z a=1 and p=0.

Referring again to Formula 1, in some embodiments, each Z independently represents:

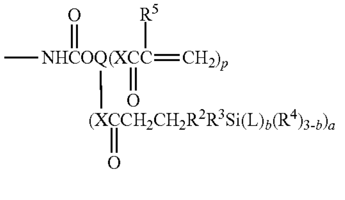

Each $R^2$ is independently —S— or —N($R^6$).

Each $R^3$ is independently a divalent alkylene group optionally substituted by one or more catenary oxygen atoms. Often $R^3$ contains from 1 to 4, 1 to 6, 1 to 8, 1 to 12, or 1 to 20 carbon atoms, however this is not a requirement. Examples of $R^3$ include methylene, ethan-1,2-diyl, propan-1,3-diyl, propan-1,2-diyl, butan-1,4-diyl, pentan-1,5-diyl, hexan-1,6-diyl, cyclohexan-1,4-diyl, octan-1,8-diyl, dodecan-1,12-diyl, hexadecan-1,16-diyl, eicosan-1,20-diyl, $—CH_2C(═O)CH_2—$, $—CH_2CH_2OCH_2CH_2—$, and $—OCH_2CH_2OCH_2CH_2OCH_2CH_2—$. Of these, $R^3$ is often $—CH_2CH_2—$, $—CH_2CH_2CH_2—$, or $—CH_2CH_2CH_2CH_2—$.

Each $R^4$ is independently a monovalent nonhydrolyzable group. Generally, any group bound to the silicon atom by a C—Si bond will not be a hydrolyzable group.

Each $R^5$ is independently H or methyl.

Each $R^6$ is independently H, a $C_1$-$C_4$ alkyl group (e.g., methyl, ethyl, propyl, or butyl), or $—R^3Si(L)_b(R^4)_{3-b}$.

Each L is independently a monovalent hydrolyzable group. Generally, any monovalent group bound to the silicon atom by a bond to a heteroatom (e.g., O, N, S, Cl, Br) will be a hydrolyzable group. Exemplary hydrolyzable groups include $C_1$-$C_6$ alkoxy groups (e.g., methoxy, ethoxy, propoxy, or butoxy) and $C_1$-$C_6$ alkylcarbonyloxy groups (e.g., acetoxy or $CH_3CH_2C(═O)O—$). Methoxy and ethoxy are often preferred.

Each b is independently 1, 2, or 3. Often, b is 3.

Each a and p are independently integers greater than or equal to 1. The quantity (a+p) is greater than and less than or equal to 6. For at least one Z (e.g., Z'), a=1. Also, for at least one Z (which may be the same as or different than Z'), p is at least 1.

Referring again to Formula 1, in other embodiments, each Z independently represents:

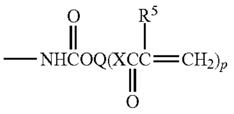

$R^5$ is H or methyl; and for at least one Z, p is at least 2.

In this embodiment, the compound may comprise at least two Z groups. In some embodiments, p is no greater than 6, 5, 4, or 3.

Compounds as described herein can be prepared by addition of substituent groups (e.g., an alcohol, primary or secondary amine, and/or thiol) to a polyisocyanate, for example, according general synthetic to methods known in the art. In some cases, a catalyst such as, for example, dibutyltin dilaurate or 1,4-diazabicyclo[2.2.2]octane (DABCO) may facilitate the addition reaction. Generally, the reactants can be combined and mixed, optionally with solvent. When a homogeneous mixture or solution is obtained a catalyst is optionally added, and the reaction mixture is heated at a temperature, and for a time sufficient for the reaction to occur.

For example, a polyisocyanate such as described above can be combined with a polysiloxane having a reactive end group (e.g., —OH, —NH($R^6$), or —SH). Such polysiloxanes can be made according to known methods and many are commercially available. Examples include monocarbinol-terminated polydimethylsiloxanes available under the trade designations MCR-C12, MCR-C18, and MCR-C22 and monoaminopropyl-terminated polydimethylsiloxanes available under the trade designations MCR-A11 and MCR-A12, all from Gelest Inc., Morrisville, Pennsylvania; monohydroxy terminated polydimethylsiloxanes, X-22-170BX and X-22-170DX of average Mn~2,800 and ~4,670 g/mol respectively from Shin-Etsu, Akron, Ohio; Monohydroxy Terminated Silicone Fluid VE-208 from Guangzhou VanEyck New Material Co., Ltd., Guangzhou, China; and monofunctional silanol polymers available under the trade designations Andisil MOH 100, Andisil MOH 1000, Andisil MOH 10000, and Andisil MOH 50000 from AB Specialty Silicones, Waukegan, Illinois.

Likewise, hydroxy-functional (meth)acrylate compounds (generally monohydroxy-functional (meth)acrylate compounds) can be reacted with remaining isocyanate groups to create free-radically polymerizable intermediate compounds containing a PDMS segment and (meth)acryl group functionality but lacking a silyl group with hydrolyzable substituents.

Exemplary hydroxy-functional multi(meth)acrylates include glycerol di(meth)acrylate (all isomers), pentaerythritol tri(meth)acrylate, trimethylolethane dimethacrylate, trimethylolethane diacrylate, and (meth)acrylic acid adduct with glycidyl (meth)acrylate.

When n≥3, hydroxy-functional mono(meth)acrylates can be utilized as well. Examples include 2-hydroxyethyl (meth) acrylate, hydroxypropyl (meth)acrylate (all isomers), hydroxybutyl (meth)acrylate (all isomers), poly(ε-caprolactone) mono[2-methacryloxy ethyl] esters, glycerol dimethacrylate, 1-(acryloxy)-3-(methacryloxy)-2-propanol, 2-hydroxy-3-phenyloxypropyl methacrylate, 2-hydroxyalkyl methacryloyl phosphate, 4-hydroxycyclohexyl methacrylate, trimethylolpropane dimethacrylate, trimethylolethane dimethacrylate, 1,4-butanediol monomethacrylate, neopentyl glycol monomethacrylate, 1,6-hexanediol monomethacrylate, 3-chloro-2-hydroxypropyl methacrylate, 2-hydroxy-3-alkyloxymethacrylate, polyethylene glycol monomethacrylate, polypropylene glycol monomethacrylate, ethylene oxide-modified phthalic acid methacrylate, and 4-hydroxycyclohexyl methacrylate.

In some embodiments, a mixture of hydroxy-functional multi(meth)acrylate(s) and hydroxy-functional mono(meth) acrylate(s) may be utilized.

Among the hydroxy-functional (meth)acrylates some acrylate-functional moieties will typically be necessary.

Addition to isocyanato groups on the intermediate compounds can be carried out, for example, using a suitable catalyst (e.g., a tin catalyst such as dibutyltin dilaurate) with heating as described hereinabove.

Thus, free-radically polymerizable compounds comprising at least one (e.g. terminal) poly(dialkylsiloxane) segment and at least two (meth)acryl groups can be prepared by reacting components comprising:

i) a compound comprising at least two isocyanate groups;

ii) a compound comprising a poly(dialkylsiloxane) segment and an isocyanate-reactive group; and iii) a compound comprising an isocyanate reactive group and at least two (meth)acrylate groups.

In some embodiments, the equivalent ratio of component ii) ranges from 0.05 to 0.60 with respect to component i).

In some embodiments, the equivalent ratio of component iii) ranges from 0.45 to 1.00 with respect to component i).

The resulting compounds comprise a terminal PDMS segment and at least two (meth)acrylate groups can provide good wetting of the release-treated nanostructured film and adhesion to the oxide coated substrate. Such compounds can also be utilized as an intermediate compound.

To provide Z groups further comprising an organosilane, the intermediate compounds, which are polyfunctional with respect to (meth)acryl groups, may be subsequently reacted by Michael addition with a corresponding organosilane having an amino, alkylamino, or mercapto group, for example.

Suitable organosilanes include, for example, 3-aminopropyltrimethoxysilane, 3-aminopropyltriethoxysilane, N-methyl-3-aminopropyltrimethoxysilane, N-butyl-3-aminopropyltrimethoxysilane, bis(3-trimethoxysilylpropyl) amine, bis(3-triethoxysilylpropyl)amine, methylbis(3-trimethoxysilylpropyl)-amine, 3-(2-aminoethyl) aminopropyltrimethoxysilane, (aminoethylaminomethyl) phenethyltrimethoxysilane, (aminoethylaminomethyl) phenethyltriethoxysilane, N-(2-aminoethyl)-3-aminopropylmethyldimethoxysilane, bis(3-triethoxysilylpropyl)amine, N-(2-aminoethyl)-3-aminopropyltributoxysilane, 6-(aminohexylaminopropyl) trimethoxysilane, 4-amino-butyltrimethoxysilane, 4-aminobutyltriethoxysilane, p-(2-aminoethyl)phenyltrimethoxysilane, 3-aminopropyltris(methoxyethoxyethoxy) silane, 3-aminopropylmethyldiethoxysilane, 3-(N-methylamino)propyltrimethoxysilane, N-(2-aminoethyl)-3-aminopropylmethyldimethoxysilane, N-(2-aminoethyl)-3-aminopropylmethyldiethoxysilane, N-(2-aminoethyl)-3-aminopropyltrimethoxysilane, N-(2-aminoethyl)-3-aminopropyltriethoxysilane, 3-aminopropylmethyldiethoxysilane, 3-aminopropylmethyldimethoxysilane, 3-aminopropyldimethylmethoxysilane, and 3-aminopropyldimethylethoxysilane.

Examples of silane compounds comprising hydrolyzable groups and a mercapto group include for example 3-mercaptopropyltriethoxysilane; 3-mercaptopropyl-trimethoxysilane; 11-mercaptoundecyltrimethoxysilane; s-(octanoyl) mercaptopropyltriethoxysilane; (mercaptomethyl) methyldiethoxysilane; and 3-mercaptopropylmethyldimethoxysilane.

Of course, different synthetic methodologies may also be used. Further illustration of synthetic methodology can be found in the Examples contained hereinbelow.

Similarly, free-radically polymerizable compounds comprising at least one poly(dialkylsiloxane) segment, at least one (meth)acryl group, and at least one hydrolyzable silyl group, which in some embodiments may be according to Formula I, can be prepared by reacting components comprising:

i) a urethane compound comprising a poly(dialkylsiloxane) segment and at least two (e.g., at least 2, at least 3, at least 4, at least 5, or at least 6) (meth)acryl groups; and ii) an organosilane compound comprising hydrolyzable groups and a group selected from amino or mercapto groups, wherein the equivalent ratio of components i) and ii) is greater than one such that (meth)acryl groups remain unreacted.

In some embodiments, the equivalent ratio of components i) and ii) is from 2:1 to 10:1 or 2:1 to 6:1.

Synthetic reactions (e.g., between components i) and ii)) or other addition/condensation reactions can be carried out in solvent.

Exemplary solvents include ketones such as acetone, methyl ethyl ketone (MEK), methyl isobutyl ketone, methyl amyl ketone and N-methyl pyrrolidone (NMP); ethers such as tetrahydrofuran, 2-methyl tetrahydrofuran and methyl tetrahydrofurfuryl ether; esters such as methyl acetate, ethyl acetate and butyl acetate; cyclic esters such as delta-valerolactone and gamma-valerolactone.

However the claimed compounds of the present disclosure are prepared, they are often accompanied by various other compounds (e.g., addition products formed in statistical amounts, other side products, or impurities). For example, combination of equal equivalents of an amine with a diisocyanate (or di(meth)acrylate) may result in a mixture of unreacted diisocyanate (or di(meth)acrylate), 1:1 adduct, and 2:1 adduct (i.e., wherein both isocyanato groups, or (meth)acryl groups, are reacted), for example in a statistical relative ratio of approximately 1:2:1.

Accordingly, the present disclosure also provides free-radically polymerizable compositions comprising one or more compounds according to the present disclosure.

In many embodiments, the free-radically polymerizable compositions further comprise at least one additional free-radically polymerizable compound (i.e., other than a free-radically polymerizable compound according to the present disclosure). In many embodiments, the at least one additional free-radically polymerizable compound comprises one or more free-radically polymerizable (meth)acryl group-containing monomers and/or oligomers. Examples include di(meth)acryl containing monomers such as 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexanedimethanol diacrylate, alkoxylated hexanediol diacrylate, alkoxylated neopentyl glycol diacrylate, caprolactone modified neopentyl glycol hydroxypivalate diacrylate, caprolactone modified neopentyl glycol hydroxypivalate diacrylate, cyclohexanedimethanol diacrylate, diethylene glycol diacrylate, dipropylene glycol diacrylate, ethoxylated bisphenol A diacrylate, hydroxypivalaldehyde modified trimethylolpropane diacrylate, neopentyl glycol diacrylate, polyethylene glycol diacrylate, propoxylated neopentyl glycol diacrylate, tetraethylene glycol diacrylate, tricyclodecanedimethanol diacrylate, triethylene glycol diacrylate, tripropylene glycol diacrylate; tri(meth) acryl containing monomers such as glycerol triacrylate, trimethylolpropane triacrylate, ethoxylated triacrylates (e.g., ethoxylated trimethylolpropane triacrylate), propoxylated triacrylates (e.g., propoxylated glyceryl triacrylate, propoxylated trimethylolpropane triacrylate), trimethylolpropane triacrylate, tris(2-hydroxyethyl)isocyanurate triacrylate; and higher functionality (meth)acryl containing monomers such as ditrimethylolpropane tetraacrylate, dipentaerythritol pentaacrylate, pentaerythritol tetraacrylate, ethoxylated pentaerythritol tetraacrylate, and caprolactone modified dipentaerythritol hexaacrylate.

Oligomeric (meth)acryl monomers such as, for example, urethane acrylates, polyester acrylates, and epoxy acrylates can also be employed. In some embodiments, the polymerizable composition comprises an aliphatic urethane acrylate oligomer available under the trade designation PHOTOMER 6210 having a tensile strength of less than 10,000 kPa; an elongation of 30-50%, a modulus ranging from 50,000 to 10,000 kPa; and a glass transition temperature ranging from 25 to 50° C.

In some embodiments, the free-radically polymerizable compositions comprise di(meth)acryl group-containing monomers in an amount of at least 25, at least 30, at least 35, at least 40, at least 45, or even at least 50 percent by weight of the free-radically polymerizable compositions.

In typical embodiments, the free-radically polymerizable composition comprises one or more free-radically polymerizable compounds (e.g., of Formula I) comprising at least one poly(dialkylsiloxane) segment, at least one (meth)acryl group, and optionally at least one hydrolyzable silyl group as described herein in an amount of at least 1, at least 2, at least 3, at least 4, at least 5, at least 6, at least 7, at least 8, at least 9, or even at least 10 percent by weight based on non-volatile solids content of the free-radically polymerizable composition. The amount of such free-radically polymerizable compound(s) is typically no greater than 50 percent by weight based on nonvolatile solids of the total free-radically polymerizable composition. The preferred concentration can vary depending on the desired properties and particular compound utilized.

Often such compositions can include an initiator for free-radical polymerization (also known as a free-radical initiator), for example, in an effective amount). Free-radical initiators can be thermally activated (e.g., peroxides and certain azo compounds) and/or photoactivated (e.g., Norrish Type I and Type II photoinitiators). Such photoinitiators are activated by exposure to actinic radiation (e.g., ultraviolet and/or visible electromagnetic radiation).

Free-radical polymerization may be accomplished by heating or exposure to actinic radiation (e.g., ultraviolet and/or visible light, gamma rays, or an electron beam), for example, depending on the presence and/or selection of free-radical initiator(s). Of these exposure to actinic radiation is often preferred due to ease of implementation.

If present, the amount of photoinitiator is typically an effective amount. In some embodiments, an effective amount of free-radical initiator comprises less than 10 percent by weight, more typically less than 7 percent by weight, and more typically less than 3 percent by weight of the total adhesive layer. It will be recognized that curing may be complete even though polymerizable (meth)acrylate groups remain.

Exemplary photoinitiators include α-cleavage photoinitiators such as benzoin and its derivatives such as α-methylbenzoin; α-phenylbenzoin; α-allylbenzoin; α-benzylbenzoin; benzoin ethers such as benzil dimethyl ketal (available as OMNIRAD 651 from iGM Resins USA, Charlotte, North Carolina, USA), benzoin methyl ether, benzoin ethyl ether, benzoin n-butyl ether; acetophenone and its derivatives such as 2-hydroxy-2-methyl-1-phenyl-1-propanone (available as DAROCUR 1173 from BASF, Florham Park, New Jersey, USA) and 1-hydroxycyclohexyl phenyl ketone (available as OMNIRAD 184 from iGM Resins); 2-methyl-1-[4-(methylthio)phenyl]-2-(4-morpholinyl)-1-propanone (available as OMNIRAD 907 from iGM Resins USA); 2-benzyl-2-(dimethylamino)-1-[4-(4-morpholinyl)phenyl]-1-butanone (available as OMNIRAD 369 from iGM Resins USA); titanium complexes such as bis(η5-2,4-cyclopentadien-1-yl) bis[2,6-difluoro-3-(1H-pyrrol-1-yl)phenyl]titanium (available as OMNIRAD 784 from iGM Resins USA); and mono- and bis-acylphosphines (available from iGM Resins USA as OMNIRAD 1700, or BASF as IRGACURE 1800, IRGACURE 1850, and DAROCUR 4265). One useful photoinitiator, a difunctional alpha hydroxyketone, is available as ESACURE ONE from iGM Resins USA.

Preferably, if an acylphosphine or acylphosphine oxide photoinitiator is utilized, it is combined with a photoinitiator (e.g., 2-hydroxy-2-methyl-1-phenyl-1-propanone) having a high extinction coefficient at one or more wavelengths of the actinic radiation. Such combination typically facilitates surface cure while maintaining low levels of often costly photoinitiator.

Other useful photoinitiators include anthraquinones (e.g., anthraquinone, 2-ethylanthraquinone, 1-chloroanthraquinone, 1,4-dimethylanthraquinone, 1-methoxyanthraquinone) and benzophenone and its derivatives (e.g., phenoxybenzophenone, phenylbenzophenone).

Free-radically polymerizable compositions according to the present disclosure may include optional additional components. Examples include organic solvent (e.g., as described hereinabove), stabilizers, colorants, photosensitizers, fillers, wetting agents, and levelling agents.

Examples of suitable sources of actinic radiation include actinic radiation include, for example, lasers, arc lamps (e.g., medium pressure mercury arc lamps), LED lamps, xenon flash lamps, microwave-driven lamps (e.g., equipped with H-type bulb or D-type bulb). Selection of appropriate exposure conditions will be within the capability of those skilled in the art.

Generally, the free-radically polymerizable compositions can be prepared by a common mixing procedure.

Free-radically polymerizable compounds and compositions including them according to the present disclosure are useful. For example, the free-radically polymerizable compositions can be disposed (e.g., as a continuous or discontinuous, optionally patterned film) on a surface of a substrate and then polymerized (e.g., by exposure to an effective amount of actinic radiation).

In some embodiments, the cured polymerizable composition may be utilized as a masking layer in a method of forming an etched nano-scale pattern as described in WO 2020/095258 (Van Lengerich et al.), for example, the disclosure of which is incorporated herein by reference.

Referring now to FIG. 1, exemplary article 100 comprises a layer 120 of free-radically polymerized composition disposed on surface 105 of substrate 110 comprising a metal oxide layer 140. Layer 120 comprises patterned nanostructures 130 forming a metasurface.

Exemplary substrates include sheets, plates, and films comprising any of glass, metal, organic polymer (e.g., polyethylene terephthalate (PET), polycarbonate (PC), polyethylene terephthalate glycol-modified (PETG), polyethylene, polyimide, polystyrene, or polyurethane), inorganic metal oxides, and combinations thereof. In some embodiments, the surface comprises a pattern including nanostructures. In some embodiments, the surface comprises a metal oxide (e.g., an oxide of titanium, zirconium, hafnium, niobium, or cerium).

Objects and advantages of this disclosure are further illustrated by the following non-limiting examples, but the particular materials and amounts thereof recited in these examples, as well as other conditions and details, should not be construed to unduly limit this disclosure.

EXAMPLES

Unless otherwise noted, all parts, percentages, ratios, etc. in the Examples and the rest of the specification are by weight. Table 1 (below) lists materials used in the examples and their sources.

TABLE 1

| DESIGNATION | DESCRIPTION | SOURCE |
|---|---|---|
| APTMS | 3-aminopropyltrimethoxysilane | Alfa Aesar, Ward Hill, Massachusetts |

TABLE 1-continued

| DESIGNATION | DESCRIPTION | SOURCE |
|---|---|---|
| APTRISTMSS | 3-aminopropyltris(trimethylsiloxy)silane obtained as SIA0620.0 | Gelest, Morrisville, Pennsylvania |
| BHT | Butylated hydroxytoluene | MilliporeSigma, Burlington, Massachusetts |
| B-PTMS | Bis-(propyltrimethoxysilyl) amine obtained as SILQUEST A-1170 | Momentive Performance Materials, Waterford, New York |
| DES N100 | Biuret of hexamethylene diisocyanate obtained as DESMODUR N100 | Covestro LLC, Pittburgh, Pennsylvania |
| Diisopropylethylamine (Hunig's Base) | Diisopropylethylamine | Alfa Aesar |
| EBECRYL 350 | Polymerizable silicon obtained as EBECRYL 350 | Allnex, Smyrna, Georgia |
| HFPO amidol | HFPO-C(O)NHCH$_2$CH$_2$OH (HFPO = poly(hexafluoropropylene oxide)) with number average molecular weight of 1371 g/mol | Prepared as described in Preparation No. 4a, Column 23, lines 51-61, of U.S. Pat. No. 7,718,264 (Klun et al.) |
| HFPO UA | HFPO urethane acrylate | Prepared by a method similar to that of Preparation No. 6, Preparation of DES N100/0.90 PET3A/0.15 HFPO as shown in column 25, lines 35-56 of U.S. Pat. No. 7,718,264 (Klun et al.) using HFPO amidol with a number average molecular weight of 1371 g/mol, and pentaerythritol triacrylate of equivalent weight 500, at 65% solids in acetone. The approximate acrylate equivalent weight was calculated similarly to those of PEI to PE6. |
| HMDSO | Hexamethyldisiloxane | Millipore Sigma |
| MPTMS | (3-mercaptopropyl) trimethoxysilane | Alfa Aesar |
| N-Me-APTMS | N-methyl-3-aminopropyltrimethoxysilane | Oakwood Chemical, Estill, South Carolina |
| PDMS-1000 | Monoaminopropyl terminated polydimethylsiloxane of approximate molecular weight 1000, obtained as MCR-A11 | Gelest |
| PDMS-2000 | monoaminopropyl terminated polydimethylsiloxane of approximate molecular weight 2000, obtained as MCR-A12 | Gelest |
| PET3A | Pentaerythritol-triacrylate-based polyacrylate obtained as SR444C | Arkema, Exton, Pennsylvania |
| PGME | Propylene glycol methyl ether | Brenntag Great Lakes, Wauwatosa, Wisconsin |
| PHOTOMER 6210 | Urethane acrylate oligomer obtained as PHOTOMER 6210 | IGM Resins, Charlotte, North Carolina |
| SR238 | 1,6-Hexanediol diacrylate obtained as SR238 | Arkema |
| SR351 | Trimethylolpropane triacrylate obtained as SR351 | Arkema |
| TEGORAD 2100 | Polymerizable silicone obtained as TEGORAD 2100 | Evonik Industries, Hopewell, Virginia |
| TEGORAD 2500 | Polymerizable silicone obtained as TEGORAD 2500 | Evonik Industries |
| TPO | 2,4,6-trimethylbenzoyldiphenylphosphine oxide obtained as OMNIRAD TPO | iGM Resins |
| UAS | Urethane acrylate silane of the following structure: 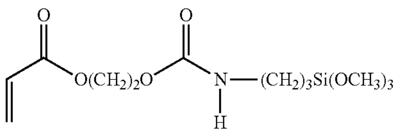 | Prepared as described in Example 7 of U.S. Pat. No. 9,790,396 (Klun et al.) |

TABLE 1-continued

| DESIGNATION | DESCRIPTION | SOURCE |
|---|---|---|
| XK-672 | Metal carboxylate catalyst obtained as K-KAT XK-672 | King Industries, Inc., Norwalk, Connecticut |
| PDMS-1000-OH | Carbinol terminated polydimethylsiloxane of approximate molecular weight 1000, obtained as MCR-C12, whose structure is believed to be $C_4H_9Si(CH_3)_2(OSi(CH_3)_2)_nSi(CH_3)_2—C_3H_6—OCH_2CH_2OH$ | Gelest |
| PDMS-2800-OH | Carbinol terminated polydimethylsiloxane of approximate molecular weight 2800, obtained as X-22-170BX, in which the carbinol end group is believed to be $—C_3H_6—OCH_2CH_2OH$. | Shin-Etsu Chemical, Tokyo, JP |
| PDMS-4700-OH | Carbinol terminated polydimethylsiloxane of approximate molecular weight 4700, obtained as X-22-170DX, in which the carbinol end group is believed to be $—C_3H_6—OCH_2CH_2OH$. | Shin-Etsu Chemical |
| PDMS-5000-OH | Carbinol terminated polydimethylsiloxane of approximate molecular weight 5000, obtained as MCR-C18, whose structure is believed to be $C_4H_9Si(CH_3)_2(OSi(CH_3)_2)_nSi(CH_3)_2—C_3H_6—OCH_2CH_2OH$ | Gelest |

Preparative Examples PE-1 to PE-6

Preparative Examples PE-1 to PE-6 were synthesized using the following general procedure and the component amounts reported in Table 2. A 250 mL round-bottom flask equipped with magnetic stirbar was charged with the given amount of DES N 100 and approximately 25 grams (g) of tetrahydrofuran (THF). Then the given amount of PDMS-2000 or PDMS-1000 was added under a dry air atmosphere via pressure equalizing dropping funnel over 70 minutes (min) at room temperature, at which point the funnel was rinsed with 5 g THF. To the reaction was added the given amount of BHT and the given amount of 10 wt % solution of XK-672 in THF. In one portion, the given amount of PET3A was added along with approximately 15 g THF. After 1 hour (h) and 20 min, the flask was placed in a 55° C. oil bath and topped with a condenser. After a further 4 h and 15 min, the reaction was adjusted to 30% solids by weight by addition of THF (such that the amount of THF is 2.33 times greater than the combined given amounts of DES N100, PDMS-2000, PDMS-1000, and PET3A) and bottled.

TABLE 2

| | PREPARATIVE EXAMPLE | | | | | |
|---|---|---|---|---|---|---|
| | PE-1 | PE-2 | PE-3 | PE-4 | PE-5 | PE-6 |
| DESIGNATION | DES N100/0.15 PDMS-2000/0.90 PET3A | DES N100/0.25 PDMS-2000/0.80 PET3A | DES N100/0.35 PDMS-2000/0.70 PET3A | DES N100/0.50 PDMS-2000/0.55 PET3A | DES N100/0.35 PDMS-1000/0.70 PET3A | DES N100/0.50 PDMS-1000/0.55 PET3A |
| Acrylate equivalent weight of overall solution, g/mol | 928.5 | 1050.3 | 1172.0 | 1391.7 | 977.5 | 1076.7 |
| DES N100, g | 3.50 | 3.50 | 3.50 | 3.50 | 5.00 | 5.00 |
| PDMS-2000, g | 5.50 | 9.16 | 12.83 | 18.32 | 0 | 0 |
| PDMS-1000, g | 0 | 0 | 0 | 0 | 9.16 | 13.09 |
| PET3A, g | 7.92 | 7.04 | 6.16 | 4.84 | 8.80 | 6.92 |
| Tetrahydrofuran (THF), g | 39.5 | 46.00 | 52.50 | 62.25 | 53.61 | 58.37 |
| BHT, g | 0.008 | 0.010 | 0.011 | 0.013 | 0.011 | 0.013 |
| XK-672, 10 wt % solution in THF, g | 0.08 | 0.10 | 0.11 | 0.13 | 0.11 | 0.13 |

Calculation of Acrylate Equivalent Weight for PE-1 to PE-6 and PE-11 to PE-20

A representative procedure for calculating the approximate acrylate equivalent weight (grams of material/moles of acrylate moiety) for PE-3 is shown below. A similar procedure was used to calculate the approximate acrylate equivalent weight (EW) of the PE-1, PE-2, PE-4, PE-5, and PEA6 and PE-11 to PE-20.

DES N100 has an isocyanate equivalent weight of 191 g/mol and an approximate isocyanate functionality of 3. DES N100 has an approximate molecular weight of 573 g/mol. PET3A has an alcohol equivalent weight and molecular weight of 480.3 g/mol. PDMS-2000 has an approximate alcohol equivalent weight and molecular weight of 2000 g/mol.

The molecule resulting from addition of one equivalent of PDMS-2000 and two equivalents of PET3A to DES N100 has an idealized structure shown below:

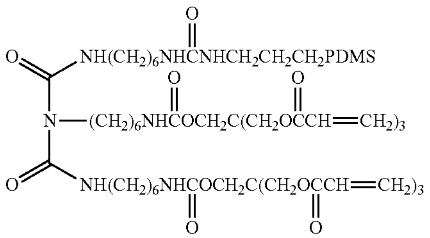

"PDMS" in the above structure represents $—(Si(CH_3)_2O)_nSi(C_4H_9)(CH_3)_2$, where n is approximately 24.7. (When PDMS-1000 is used in a given Preparative Example, n is approximately 11.2). The approximate molecular weight of the molecule shown above is 573+2000+2·480.3=3533.6 g/mol. The structure has 6 acrylates, so its acrylate EW is 3533.6/6=588.9 g/eq.

The molecule resulting from the addition of three equivalents of PET3A to DES N100 has an idealized structure shown below:

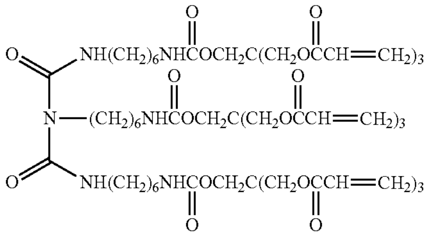

The approximate molecular weight of the molecule shown above is 573+3·480.3=2013.9 in g/mol. The structure has 9 acrylates, so its acrylate EW is 2013.9/9=223.8 g/eq.

The resultant material PE-3 will ideally comprise a mixture of the two molecules shown above. The ratio of the two molecules in the mixture will be dictated by the molar equivalents of PDMS-2000 (or PDMS-1000) and PET3A added (note that a 0.05 equivalent excess of PET3A is added but ignored in the calculation). For PE-3, 0.35 molar equivalents of PDMS-2000 (with respect to the isocyanate equivalents of DES N100) were added, resulting in a mixture that is 35% of the first structure above (acrylate equivalent weight 588.9) and 65% of the second structure above (acrylate equivalent weight 223.8). Therefore, the average acrylate equivalent weight of the PE-3 mixture is: 0.35*588.93+0.65*223.8=351.6 g/eq. Since the final PE-3 material is provided as a 30% by weight solution in THF, the acrylate equivalent weight of the solution is 351.6/0.3=1172.0 g/eq.

Preparative Example 7

DES N100/0.35 PDMS-2000/0.30 APTMS/0.4 PET3A

A 250-mL round-bottom flask equipped with magnetic stirbar was charged with 2.86 g DES N100 and 28.57 g THF and placed in a 55° C. oil bath. Then, 10.47 g PDMS-2000 was added under a dry air atmosphere via pressure equalizing dropping funnel over 1.5 h, at which point the funnel was rinsed with 5 g THF. After 10 minutes, 0.80 g APTMS was charged to the reaction in one portion. After 2 h, to the reaction was added 0.009 g BHT, 0.085 g of 10 wt % solution of XK-672 in THF, and 2.87 g PET3A. The reaction was allowed to run for 6 h more at 55° C., and then allowed to cool overnight. The reaction was adjusted to have a total of 33.52 g THF. It was then diluted to 30% solids by weight with 6.13 g isopropanol (IPA), bottled, and stored in a −30° C. freezer.

Preparative Example 8

DES N100/0.35 PDMS-1000/0.30 APTMS/0.4 PET3A

A 250-mL round-bottom flask equipped with magnetic stirbar was charged with 3.50 g DES N100 and 26.00 g THF and placed in a 55° C. oil bath. Then 6.41 g PDMS-1000 was added under a dry air atmosphere via pressure equalizing dropping funnel over 1.5 h, at which point the funnel was rinsed with 5 g THF. After 10 minutes, 0.99 g APTMS was charged to the reaction in one portion. After 2 h, to the reaction was added 0.007 g BHT, 0.07 g of 10 wt % solution of XK-672 in THF, and 3.52 g PET3A. The reaction was allowed to run for 6 h more at 55° C., and then allowed to cool overnight. It was then diluted to 30% solids (by weight) with 7.60 g isopropanol (IPA), bottled, and stored in a −30° C. freezer.

Preparative Example 9

DES N100/0.15 HFPO amidol/0.9 PET3A/0.33 N-Me-APTMS

A 20-mL vial equipped with a stir bar was charged with 5 g of HFPO UA (0.012 acrylate equivalents; acrylate equivalent weight 415.4 g/mol) and 0.754 g N-Me-APTMS (0.0039 equivalents). The reaction was stirred for 1.25 hours at room temperature, and then stored at −30° C. The resulting material was 69.6% solids by weight.

Preparative Example PE-10

Photopolymerizable Resin Solution

A standard polymerizable resin consisting of 9.7 parts by weight of PHOTOMER 6210 with 3.2 parts by weight SR238, 0.06 parts by weight TPO, 43.5 parts by weight methyl ethyl ketone (MEK) and 43.5 parts by weight PGME was prepared in a glass vessel.

Examples EX-1 TO EX-18

To a 20-mL glass vial with magnetic stirbar was added the given amount of a given Preparative Example solution (30 weight percent solution as described above, given in the "Starting Material" column of Table 3). The given amount of N-Me-APTMS was then added to the vial. The resulting mixture was stirred at RT for at least 1 hour, then stored at −30° C. until use.

TABLE 3

| EXAMPLE | EXAMPLE DESIGNATION | STARTING MATERIAL | STARTING MATERIAL AMOUNT, g | N—Me-APTMS AMOUNT, g | WT % SOLIDS |
|---|---|---|---|---|---|
| EX-1 | DES N100/0.15 PDMS-2000/0.90 | PE-1 | 5.0 | 0.156 | 32 |

TABLE 3-continued

| EXAMPLE | EXAMPLE DESIGNATION | STARTING MATERIAL | STARTING MATERIAL AMOUNT, g | N—Me-APTMS AMOUNT, g | WT % SOLIDS |
|---|---|---|---|---|---|
| EX-2 | PET3A/0.15 N—Me-APTMS DES N100/0.15 PDMS-2000/0.90 | PE-1 | 5.0 | 0.312 | 34 |
| EX-3 | PET3A/0.3 N—Me-APTMS DES N100/0.15 PDMS-2000/0.90 | PE-1 | 5.0 | 0.467 | 36 |
| EX-4 | PET3A/0.45 N—Me-APTMS DES N100/0.25 PDMS-2000/0.80 | PE-2 | 5.0 | 0.138 | 32 |
| EX-5 | PET3A/0.15 N—Me-APTMS DES N100/0.25 PDMS-2000/0.80 | PE-2 | 5.0 | 0.276 | 34 |
| EX-6 | PET3A/0.3 N—Me-APTMS DES N100/0.25 PDMS-2000/0.80 | PE-2 | 5.0 | 0.414 | 36 |
| EX-7 | PET3A/0.45 N—Me-APTMS DES N100/0.35 PDMS-2000/0.70 | PE-3 | 5.0 | 0.124 | 32 |
| EX-8 | PET3A/0.15 N—Me-APTMS DES N100/0.35 PDMS-2000/0.70 | PE-3 | 10.0 | 0.495 | 33 |
| EX-9 | PET3A/0.3 N—Me-APTMS DES N100/0.35 PDMS-2000/0.70 | PE-3 | 10.0 | 0.742 | 35 |
| EX-10 | PET3A/0.45 N—Me-APTMS DES N100/0.50 PDMS-2000/0.55 | PE-4 | 5.0 | 0.104 | 31 |
| EX-11 | PET3A/0.15 N—Me-APTMS DES N100/0.50 PDMS-2000/0.55 | PE-4 | 10.0 | 0.4167 | 33 |
| EX-12 | PET3A/0.3 N—Me-APTMS DES N100/0.50 PDMS-2000/0.55 | PE-4 | 10.0 | 0.625 | 34 |
| EX-13 | PET3A/0.45 N—Me-APTMS DES N100/0.35 PDMS-1000/0.70 | PE-5 | 5.0 | 0.148 | 32 |
| EX-14 | PET3A/0.15 N—Me-APTMS DES N100/0.35 PDMS-1000/0.70 | PE-5 | 5.0 | 0.297 | 34 |
| EX-15 | PET3A/0.3 N—Me-APTMS DES N100/0.35 PDMS-1000/0.70 | PE-5 | 5.0 | 0.445 | 36 |
| | PET3A/0.45 N—Me-APTMS | | | | |

TABLE 3-continued

| EXAMPLE | EXAMPLE DESIGNATION | STARTING MATERIAL | STARTING MATERIAL AMOUNT, g | N—Me-APTMS AMOUNT, g | WT % SOLIDS |
|---|---|---|---|---|---|
| EX-16 | DES N100/0.50 PDMS-1000/0.55 PET3A/0.15 N—Me-APTMS | PE-6 | 5.0 | 0.135 | 32 |
| EX-17 | DES N100/0.50 PDMS-1000/0.55 PET3A/0.3 N—Me-APTMS | PE-6 | 5.0 | 0.27 | 34 |
| EX-18 | DES N100/0.50 PDMS-1000/0.55 PET3A/0.45 N—Me-APTMS | PE-6 | 5.0 | 0.404 | 35 |

Examples EX-19 to EX-30 and Comparative Examples CE-1 to CE-11

Examples EX-19 to EX-30 along with Comparative Examples CE-1 to CE-10 were prepared by combining the given amounts of the components in Table 4 in glass vials and stirring to mix. Note that the "Additive Identity" column refers to several Example materials that are provided as solutions of active components in solvent, according to their respective synthetic details above.

TABLE 4

| EXAMPLE | ADDITIVE IDENTITY | ADDITIVE, g | UAS, g | PE-10, g |
|---|---|---|---|---|
| CE-1 | | | | 20.0 |
| CE-2 | PE-9 | 0.2 | | 20.0 |
| EX-19 | EX-1 | 0.43 | | 20.0 |
| EX-20 | EX-3 | 0.38 | | 20.0 |
| EX-21 | EX-5 | 0.41 | | 20.0 |
| EX-22 | EX-6 | 0.43 | | 20.0 |
| EX-23 | EX-7 | 0.41 | | 20.0 |
| EX-24 | EX-8 | 0.39 | | 20.0 |
| EX-25 | EX-9 | 0.44 | | 20.0 |
| EX-26 | EX-10 | 0.42 | | 20.0 |
| EX-27 | EX-12 | 0.40 | | 20.0 |
| EX-28 | EX-13 | 0.40 | | 20.0 |
| EX-29 | EX-17 | 0.41 | | 20.0 |
| EX-30 | EX-1 | 0.143 | | 20.0 |
| CE-3 | PE-7 | 0.46 | | 20.0 |
| CE-4 | PE-8 | 0.46 | | 20.0 |
| CE-5 | TEGORAD 2100 | 0.137 | 0.137 | 20.0 |
| CE-6 | TEGORAD 2500 | 0.137 | 0.137 | 20.0 |
| CE-7 | EBECRYL 350 | 0.137 | 0.137 | 20.0 |
| CE-8 | APTRISTMSS | 0.137 | 0.137 | 20.0 |
| CE-9 | PE-3 | 0.46 | | 20.0 |
| CE-10 | PE-3 | 0.46 | 0.137 | 20.0 |
| CE-11 | HFPO-UA | 0.21 | | 20.0 |

After preparation the above solutions, nanoreplication experiments were conducted to test for performance, considering both 1) wet out against a release-treated substrate and 2) coupling to metal oxide coated PET substrate during a nanoreplication process.

Creation of Patterned Template Film

A tooling film was created via UV replication against a nickel master. The nickel master was a nanostructured tool with a 65 mm×65 mm square packed hole array of 310 nm deep holes having a diameter of 200 nm, a pitch of 400 nm, and a draft angle of 6.3 degrees. A resin was prepared by combining and mixing PHOTOMER 6210, SR238, SR351 and TPO in weight ratios of 60/20/20/0.5. The resin was coated onto a 125 μm thick polycarbonate film to sufficiently wet the nickel surface and form a rolling bead of resin as the coated polycarbonate film was pressed against the nanostructured nickel surface.

The film was exposed to radiation from two Fusion UV lamp systems ("F600" from Fusion UV Systems) fitted with D bulbs both operating at 142 W/cm while in contact with the nanostructured nickel surface. After peeling the film from the nanostructured nickel surface, the nanostructured side of the film was again exposed to radiation from a Fusion UV lamp system. Following the UV radiation in contact with the surface and the subsequent fusion exposure, the resin was solidified in a square packed array of posts, the opposite generation of the nickel tooling.

The patterned template film was then release treated with HMDSO using the Method for Release Treatment described on page 60, line 19 to page 61, line 11 of WO 2020/095258 (Van Lengerich et al.) to create a releasable surface suitable for nanoreplication. The release treatment was necessary to enable the acrylate resin to cleanly separate from the template film after UV replication, enabling transfer to the oxide coated substrate. The oxide coated PET film (Melinex ST504 Du Pont Teijin Films, Chester, Virginia, United States) was prepared via sputter-coating a silicon-containing etch resist (25 nm of $SiAl_xO_y$), generally as described on page 22, line 28 to page 29, line 11 of PCT Patent Publ. WO 2017/003870 (Rowe et al.).

Low-Land Transfer Process

The coating solutions of Examples EX-19 to EX-30 and Comparative Examples CE-1 to CE-11 were used in a coating and curing process known as low land transfer, described below. The low land transfer process was carried out at the benchtop to test for wet out of the solution onto the tooling film and transfer of the pattern to the oxide coating on the PET substrate. First, a pipette was used to dispense approximately 1 mL of a given coating solution onto the HMSDO treated template film. Next, a #4 wire wound rod (delivering a wet-film thickness of 0.4 thousandths of an inch (mil), or ~10 micrometers (μm)) was drawn down to spread the coating over the structured section of the template film. The film was then left at ambient conditions for 120 seconds (s) to allow for solvent to evaporate. Throughout the evaporation process, the film was observed for any dewetting, both inside and outside of the patterned region.

Following the 120 s dwell time, the solvent had evaporated, and the film had dried down to approximately a 1.3 microns coating thickness. This film was laminated using a 1 inch (2.5 cm) wide handroll laminator onto the oxide coated PET substrate. Following the lamination, the film stack was exposed to approximately 20 seconds of 385 nm UV-LED curing source sufficient to solidify the coating. The films were then separated and inspected for replication and transfer quality. Results of these studies are reported in Table 5.

In Table 5, wettability of the coating solution against the release treated HMDSO surface was evaluated according to the ranking scale as follows:

Poor—Coating solution de-wet or broke up into small beads on either the patterned and/or the un-patterned area of the template film.

Good—Coating solution remained wet out in a continuous layer over the template film.

In Table 5, the pattern transfer of the nanostructure on the oxide surface was evaluated to determine the pattern transfer quality according to the ranking scale as follows:

0—Failure to transfer any pattern to substrate

1—Major pattern transfer failure (>50% pattern transfer failure)

2—Minor pattern transfer failure (slight failure or tearing of pattern around edges)

3—Complete pattern transfer

TABLE 5

| EXAMPLE | WETTABILITY RATING | TRANSFER RATING |
|---|---|---|
| CE-1 | Poor | 1 |
| CE-2 | Good | 3 |
| EX-19 | Good | 2 |
| EX-20 | Good | 2 |
| EX-21 | Good | 2 |
| EX-22 | Good | 3 |
| EX-23 | Good | 3 |
| EX-24 | Good | 3 |
| EX-25 | Good | 3 |
| EX-26 | Good | 2 |
| EX-27 | Good | 3 |
| EX-28 | Good | 3 |
| EX-29 | Good | 3 |
| EX-30 | Poor | 3 |
| CE-3 | Poor | 2 |
| CE-4 | Poor | 2 |
| CE-5 | Good | 1 |
| CE-6 | Poor | 3 |
| CE-7 | Good | 0 |
| CE-8 | Poor | 0 |
| CE-9 | Good | 3 |
| CE-10 | Good | 3 |
| CE-11 | Good | 1 |

Examples EX-31 to EX-34 and Comparative Examples CE-12 TO CE-15

Creation of Coating Solutions

Coating solutions of Examples EX-31 to EX-34 along with Comparative Examples CE-1 to CE-9 were created by combining the given amounts of the components in Table 6 in glass vials and stirring to mix them. Note that the "Additive Identity" column refers to several Example materials that are provided as solutions of active components in solvent, according to their respective synthetic details above.

TABLE 6

| EXAMPLE | ADDITIVE IDENTITY | ADDITIVE, g | UAS, g | PE-10, g |
|---|---|---|---|---|
| CE-12 | PE-9 | 0.98 | | 100.00 |
| CE-13 | HFPO-UA | 1.05 | 0.34 | 100.00 |
| CE-14 | HFPO-UA | 1.05 | 0.68 | 100.00 |
| CE-15 | HFPO-UA | 1.05 | 1.03 | 100.00 |
| EX-31 | EX-7 | 0.39 | | 100.00 |
| EX-32 | EX-7 | 1.00 | | 100.00 |
| EX-33 | EX-7 | 2.05 | | 100.00 |
| EX-34 | EX-7 | 3.17 | | 100.00 |

Roll-to-Roll Pattern Transfer

The pattern was transferred from the template film to the oxide-coated PET in the following roll-to-roll process. Portions of the release-treated template film used in Examples EX-19 to EX-30 and Comparative Examples CE-1 to CE-11 were slot-die coated, each with a different one of the coating solutions of Examples EX-31 to EX-34 and Comparative Examples CE12 to CE-15, at a rate of 0.0508 meters per second. In each case, the solution was coated 10.2 cm wide and pumped with a Harvard syringe pump at a rate of 1.20 mL/min. The coating was dried at ambient conditions, and then partially cured 10 meters downstream from the solution application using a nitrogen-inerted 385 nm UV-LED system powered at 0.25 Amps at 40 volts. The coated film was then laminated with $SiAl_xO_y$-coated film used in Examples EX-19 to EX-30 and Comparative Examples CE-1 to CE-11. The nip consisted of a 90-durometer rubber roll and a steel roll set at 54° C. The nip was engaged by two air cylinders pressed by 0.28 MPa. All web tensions were set to be approximately 0.0057 N/m. The solution was cured using a Fusion UV Systems microwave-driven lamp (Heraeus, Hanau, Germany) equipped with a D-type bulb, and the dried coating solution was separated from the release-treated template film to oxide-coated film with fidelity varying depending on solution composition. The results are shown in Table 7 (below), using the same wettability and transfer rating scheme as used for Table 5.

TABLE 7

| EXAMPLE | WETTABILITY RATING | TRANSFER RATING |
|---|---|---|
| CE-12 | good | 1 |
| CE-13 | good | 2 |
| CE-14 | good | 2 |
| CE-15 | good | 2 |
| EX-31 | poor | 2 |
| EX-32 | poor | 3 |
| EX-33 | good | 3 |
| EX-34 | good | 3 |

Synthesis of Preparative Examples PE-11 to PE-16

Preparative Examples PE-11 to PE-16 were synthesized using the same general procedure as for PE-1 to PE-6, with the exception that for PE-11, PE-12, PE-14, PE-15, and PE-16 using PDMS carbinols, that the XK-672 was charged with the DES N 100 and THF. The component amounts are reported in Table 8 and 9.

TABLE 8

| | PREPARATIVE EXAMPLE | | | | | |
|---|---|---|---|---|---|---|
| | PE-11 | PE-12 | PE-13 | PE-14 | PE-15 | PE-16 |
| DESIGNATION | DES N100/0.35 PDMS-1000-OH/0.70 PET3A | DES N100/0.35 PDMS-5000-OH/0.70 PET3A | DES N100/0.15 PDMS-1000/0.90 PET3A | DES N100/0.35 PDMS-2800-OH/0.70 PET3A | DES N100/0.35 PDMS-4700-OH/0.70 PET3A | DES N100/0.25 PDMS-4700-OH/0.80 PET3A |
| Acrylate equivalent weight of 30% solids solution, g/mol | 977.5 | 1755.25 | 845.13 | 1327.47 | 1696.91 | 1425.19 |
| DES N100, g | 5.00 | 2.00 | 5.00 | 3.5 | 2.5 | 2.5 |
| PDMS-1000, g | | | 3.93 | | | |
| PDMS-1000-OH, g | 9.16 | | | | | |
| PDMS-2800-OH, g | | | | 17.96 | | |
| PDMS-4700-OH, g | | | | | 21.53 | 15.38 |
| PDMS-5000-OH, g | 0 | 18.32 | | | | |
| PET3A, g | 8.80 | 3.52 | 11.32 | 6.16 | 4.40 | 5.28 |
| Tetrahydrofuran (THF), g | 53.61 | 55.76 | 47.26 | 64.48 | 66.37 | 54.07 |
| BHT, g | 0.011 | 0.010 | 0.010 | 0.014 | 0.014 | 0 |
| XK-672, 10 wt. % solution in THF, g | 0.115 | 0.119 | 0.101 | 0.138 | 0.142 | 0.116 |

TABLE 9

| | PREPARATIVE EXAMPLE | | | |
|---|---|---|---|---|
| | PE-17 | PE-18 | PE-19 | PE-20 |
| DESIGNATION | DES N100/0.15 PDMS-5000-OH/0.90 PET3A | DES N100/0.25 PDMS-2800-OH/0.80 PET3A | DES N100/0.25 PDMS-1000/0.80 PET3A | DES N100/0.15 PDMS-1000/0.90 PET3A |
| Acrylate equivalent weight of 30% solids solution, g/mol | 1178.5 | 1161.3 | 845.13 | 1327.47 |
| DES N100, g | 3.50 | 3.5 | 5.00 | 5.00 |
| PDMS-1000, g | | | 6.54 | 3.93 |
| PDMS-2800-OH, g | | 12.83 | | |
| PDMS-5000-OH, g | 13.74 | | | |
| PET3A, g | 8.71 | 7.04 | 10.06 | 11.32 |
| Tetrahydrofuran (THF), g | 58.75 | 54.55 | 50.43 | 47.26 |
| BHT, g | 0.013 | 0.012 | 0.011 | 0.010 |
| XK-672, 10 wt % solution in THF, g | 0.13 | 0.12 | 0.11 | 0.10 |

Examples EX-35 to EX-40

The following Examples were prepared in a manner similar to EXAMPLES EX-1 TO EX-18.

To a 20-mL glass vial with magnetic stirbar was added the given amount of a given Preparative Example solution (30 weight percent solution as described above, given in the "Starting Material" column of Tables 10. The given amount of coupling agent was then added to the vial. The resulting mixture was stirred at RT for at least 1 hour, then stored at −30° C. until use.

TABLE 10

| EXAMPLE | EXAMPLE DESIGNATION | STARTING MATERIAL | STARTING MATERIAL AMOUNT, g | N—Me-APTMS AMOUNT, g | WT % SOLIDS |
|---|---|---|---|---|---|
| EX-35 | DES N100/0.35 PDMS-2000/0.70 PET3A/0.3 N—Me-APTMS | PE-3 | 30 | 1.48 | 33.3 |

TABLE 10-continued

| EXAMPLE | EXAMPLE DESIGNATION | STARTING MATERIAL | STARTING MATERIAL AMOUNT, g | N—Me-APTMS AMOUNT, g | WT % SOLIDS |
|---|---|---|---|---|---|
| EX-36 | DES N100/0.35 PDMS-2000/0.70 PET3A/0.45 MPTMS | PE-3 | 5.0 | 0.419 *MPTMS used in place of N—Me-APTMS | 34.8 |
| EX-37 | DES N100/0.15 PDMS-1000/0.90 PET3A/0.15 N—Me-APTMS | PE-13 | 5.0 | 0.172 | 32.3 |
| EX-38 | DES N100/0.15 PDMS-1000/0.90 PET3A/0.30 N—Me-APTMS | PE-13 | 5.0 | 0.343 | 34.0 |
| EX-39 | DES N100/0.35 PDMS-1000-OH/0.70 PET3A/0.30 N—Me-APTMS | PE-11 | 5.0 | 0.297 | 34.0 |
| EX-40 | DES N100/0.35 PDMS-5000-OH/0.70 PET3A/0.3 N—Me-APTMS | PE-12 | 5.0 | 0.165 | 32.2 |

Examples EX-41 to EX-55 and Comparative Example CE-16

Examples EX-41 TO EX-55 along with Comparative Examples CE-16 were prepared by combining the given amounts of the components in Table 11 in glass vials and stirring to mix. Note that the "Additive Identity" column refers to several Example materials that are provided as solutions of active components in solvent, according to their respective synthetic details above.

TABLE 11

| EXAMPLE | ADDITIVE IDENTITY | ADDITIVE, g | Percentage of solids that is additive | PE-10, g |
|---|---|---|---|---|
| CE-16 (repeat of CE-1) | | | | 20.0 |
| EX-41 | EX-35 | 0.41 | 5 | 20.0 |
| EX-42 | EX-36 | 0.40 | 5 | 20.0 |
| EX-43 | EX-37 | 0.42 | 5 | 20.0 |
| EX-44 | EX-38 | 0.40 | 5 | 20.0 |
| EX-45 | EX-39 | 0.40 | 5 | 20.0 |
| EX-46 | EX-40 | 0.42 | 5 | 20.0 |
| Examples Lacking Amino Silane | | | | |
| EX-46 | PE-1 | 0.46 | 5 | 20.0 |
| EX-47 | PE-2 | 0.46 | 5 | 20.0 |
| EX-48 | PE-3 | 0.46 | 5 | 20.0 |
| EX-49 | PE-3 | 0.70 | 7.5 | 20.0 |
| EX-50 | PE-3 | 0.96 | 10 | 20.0 |
| EX-51 | PE-13 | 0.46 | 5 | 20.0 |
| EX-52 | PE-5 | 0.46 | 5 | 20.0 |
| EX-53 | PE-6 | 0.46 | 5 | 20.0 |
| EX-54 | PE-11 | 0.46 | 5 | 20.0 |
| EX-55 | PE-12 | 0.46 | 5 | 20.0 |

The coating solutions of Examples CE-16 and Examples EX-41 to EX-55 were used in a coating and curing process known as low land transfer, described as above for Examples EX-19 to EX-30 and Comparative Examples CE-1 to CE-11. The results are shown in Table 12, using the same wettability and transfer rating scheme as used for Table 5.

TABLE 12

| EXAMPLE | WETTABILITY RATING | TRANSFER RATING |
|---|---|---|
| CE-16 (repeat of CE-1) | Poor | 0 |
| EX-41 | Good | 3 |
| EX-42 | Good | 3 |
| EX-43 | Good | 3 |
| EX-44 | Good | 3 |
| EX-45 | Good | 3 |
| EX-46 | Poor | 1 |
| Examples Lacking Amino Silane | | |
| EX-46 | Good | 3 |
| EX-47 | Good | 3 |
| EX-48 | Good | 3 |
| EX-49 | Good | 3 |
| EX-50 | Good | 3 |
| EX-51 | Good | 3 |
| EX-52 | Good | 3 |
| EX-53 | Good | 3 |
| EX-54 | Good | 3 |
| EX-55 | Poor | 1 |

Examples EX-56 to EX-61

The following Examples were prepared in a manner similar to EXAMPLES EX-1 TO EX-18.

To a 20-mL glass vial with magnetic stirbar was added the given amount of a given Preparative Example solution (30 weight percent solution as described above, given in the "Starting Material" column of Table 13). The given amount of coupling agent was then added to the vial. The resulting mixture was stirred at RT for at least 1 hour, then stored at −30° C. until use.

TABLE 13

| EXAMPLE | EXAMPLE DESIGNATION | STARTING MATERIAL | STARTING MATERIAL AMOUNT, g | N—Me-APTMS AMOUNT, g | WT % SOLIDS |
|---|---|---|---|---|---|
| EX-56 | DES N100/0.35 PDMS-2000/0.70 PET3A/0.3 APTMS | PE-3 | 10 | 0.46* *APTMS used in place of N—Me-APTMS | 33.3 |
| EX-57 | DES N100/0.35 PDMS-2800-OH/0.70 PET3A/0.3 N—Me-APTMS | PE-14 | 10 | 0.44 | 33.3 |
| EX-58 | DES N100/0.35 PDMS-4700-OH/0.90 PET3A/0.3 N—Me-APTMS | PE-15 | 10.0 | 0.34 | 32.3 |
| EX-59 | DES N100/0.25 PDMS-4700-OH/0.80 PET3A/0.3 N—Me-APTMS | PE-16 | 10.0 | 0.41 | 32.7 |
| EX-60 | DES N100/0.15 PDMS-5000-OH/0.90 PET3A/0.30 N—Me-APTMS | PE-17 | 10.0 | 0.49 | 33.3 |
| EX-61 | DES N100/0.25 PDMS-2800-OH/0.80 PET3A/0.3 N—Me-APTMS | PE-18 | 10 | 0.495 | 33.3 |

Examples EX-62 to EX-78 and Comparative Example CE-17

Examples, and EX-66 to EX-72 along with Comparative Example CE-17 were prepared by combining the given amounts of the components in Table 14 in glass vials and stirring to mix. Note that the "Additive Identity" column refers to several Example materials that are provided as solutions of active components in solvent, according to their respective synthetic details above. The results are shown in Table 15, using the same wettability and transfer rating scheme as used for Table 5.

TABLE 14

| EXAMPLE | ADDITIVE IDENTITY | ADDITIVE, g | Percentage of solids that is additive | PE-10, g |
|---|---|---|---|---|
| CE-17 (repeat of CE-1) | | | | 20.0 |
| EX-62 | EX-35 | 0.41 | 5 | 20.0 |
| EX-63 | EX-56 | 0.42 | 5 | 20.0 |
| EX-64 | EX-57 | 0.42 | 5 | 20.0 |
| EX-65 | EX-58 | 0.42 | 5 | 20.0 |
| EX-66 | EX-59 | 0.42 | 5 | 20.0 |
| EX-67 | EX-60 | 0.41 | 5 | 20.0 |
| EX-68 | EX-61 | 0.41 | 5 | 20.0 |
| Examples Lacking Amino Silane | | | | |
| EX-69 | PE-14 | 0.46 | 5 | 20.0 |
| EX-70 | PE-15 | 0.46 | 5 | 20.0 |
| EX-71 | PE-16 | 0.46 | 5 | 20.0 |
| EX-72 | PE-17 | 0.46 | 5 | 20.0 |
| EX-73 | PE-18 | 0.46 | 5 | 20.0 |
| EX-74 | PE-13 | 0.46 | 5 | 20.0 |
| EX-75 | PE-19 | 0.46 | 5 | 20.0 |
| EX-76 | PE-20 | 0.46 | 5 | 20.0 |

TABLE 14-continued

| EXAMPLE | ADDITIVE IDENTITY | ADDITIVE, g | Percentage of solids that is additive | PE-10, g |
|---|---|---|---|---|
| EX-77 | PE-20 | 0.22 | 2.5 | 20.0 |
| EX-78 | PE-19 | 0.22 | 2.5 | 20.0 |

TABLE 15

| EXAMPLE | WETTABILITY RATING | TRANSFER RATING |
|---|---|---|
| CE-13 (repeat of CE-1) | Poor | 0 |
| EX-62 | Good | 3 |
| EX-63 | Good | 3 |
| EX-64 | Good | 3 |
| EX-65 | Good | 3 |
| EX-66 | Good | 3 |
| EX-67 | Poor | 1 |
| EX-68 | Good | 3 |
| EX-69 | Good | 3 |
| EX-70 | Poor | 1 |
| EX-71 | Poor | 1 |
| EX-72 | Good | 3 |
| EX-73 | Good | 3 |
| EX-74 | Good | 3 |
| EX-75 | Poor | 1 |
| EX-76 | Good | 3 |
| EX-77 | Good | 3 |
| EX-78 | Good | 3 |

All cited references, patents, and patent applications in this application that are incorporated by reference, are incorporated in a consistent manner. In the event of inconsistencies or contradictions between portions of the incorporated references and this application, the information in this application shall control. The preceding description, given in order to enable one of ordinary skill in the art to practice the claimed disclosure, is not to be construed as limiting the scope of the disclosure, which is defined by the claims and all equivalents thereto.

What is claimed is:

1. A free-radically polymerizable compound represented by the formula:

wherein:

$R_i$ a C1-C60 organic group having a valence of m+n;

each PDMS independently represents a monovalent group containing a poly(dialkylsiloxane) segment;

each Q is independently a covalent bond or an organic linking group having a valence of at least 2;

each X is independently O, S, or NR1, wherein each R1 is independently H or a C1-C4 alkyl group;

m and n are independently integers≥1; and each Z independently represents:

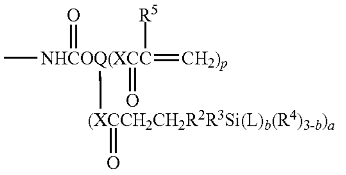

wherein:

R2 is —S— or —N(R6)-, wherein R6 is H, a C1-C4 alkyl group, or —R3Si(L)b(R4)3-b;

R3 is a divalent alkylene group optionally substituted by one or more catenary oxygen atoms;

R4 is a monovalent nonhydrolyzable group;

R5 is H or methyl;

each L is independently a monovalent hydrolyzable group;

each b is independently 1, 2, or 3; and a and p are independently integers greater than or equal to 0, wherein: 1≤(a+p)≤6; for at least one Z, a is at least 1; and for at least one Z, p is at least 1;

and the compound is according to one of the following:

I) wherein m=1 and n=1;

II) wherein m=1 and n=2; and

III) wherein 4≤(m+n)≤10 and 3≤n≤9.

2. A free-radically polymerizable composition comprising a plurality of different free-radically polymerizable compounds according to claim 1.

3. The free-radically polymerizable composition of claim 2, further comprising at least one additional free-radically polymerizable compound.

4. The free-radically polymerizable composition of claim 2, wherein the polymerizable composition further comprises at least one free-radical photoinitiator.

5. A method of making a polymerized composition, the method comprising:

providing a polymerizable composition comprising at least one free-radically polymerizable compound according to claim 1; and free-radically polymerizing the polymerizable composition to provide the polymerized composition.

6. The method of claim 5, wherein the polymerizable composition further comprises at least one additional free-radically polymerizable compound.

7. The method of claim 5, wherein the polymerizable composition further comprises at least one free-radical photoinitiator, and the method further comprises exposing the polymerizable composition to an effective amount of actinic radiation.

8. A method of making an article, the method comprising the steps:

a) disposing a layer of free-radically polymerizable composition on a mold surface of a first substrate, wherein the mold surface comprises a pattern including nanostructures; wherein the free-radically polymerizable composition comprises a plurality of different free-radically polymerizable compounds of claim 1;

b) contacting the layer of the free-radically polymerizable composition with a metal oxide surface of a second substrate;

c) free-radically polymerizing at least a portion of the free-radically polymerizable composition to provide a polymerized composition; and d) separating the polymerized composition from the mold surface.

9. The method of claim 8, wherein said free-radically polymerizing in step c) comprises exposing the free-radically polymerizable composition to actinic radiation.

10. An article made according to the method of claim 8.

* * * * *